United States Patent
Goldbach et al.

(10) Patent No.: US 6,873,000 B2
(45) Date of Patent: Mar. 29, 2005

(54) STORAGE CELL FIELD AND METHOD OF PRODUCING THE SAME

(75) Inventors: Matthias Goldbach, Dresden (DE); Till Schlösser, Dresden (DE)

(73) Assignee: Infineon Technologies AG, Munich (DE)

(*) Notice: Subject to any disclaimer, the term of this patent is extended or adjusted under 35 U.S.C. 154(b) by 135 days.

(21) Appl. No.: 10/266,188

(22) Filed: Oct. 7, 2002

(65) Prior Publication Data

US 2003/0072198 A1 Apr. 17, 2003

(30) Foreign Application Priority Data

Oct. 5, 2001 (DE) ......................................... 101 49 199

(51) Int. Cl.$^7$ ............................................. H01L 27/108
(52) U.S. Cl. ............................... 257/301; 257/E21.653; 257/E27.093; 438/222; 438/245; 438/481
(58) Field of Search .................. 257/E21.653, E27.093; 438/245, 222, 481

(56) References Cited

U.S. PATENT DOCUMENTS

| | | |
|---|---|---|
| 4,906,591 A | 3/1990 | Okumura |
| 6,326,262 B1 * | 12/2001 | Temmler et al. ............ 438/245 |

FOREIGN PATENT DOCUMENTS

| | | |
|---|---|---|
| DE | 38 41 927 A1 | 6/1989 |
| DE | 38 44 388 A1 | 8/1989 |
| GB | 2 215 913 A | 9/1989 |

OTHER PUBLICATIONS

D. Widmann et al.: "Technologie hochintegrierter Schaltungen" [technology of highly integrated circuits], *Springer Verlag, Berlin*, 2$^{nd}$ ed., 1996, pp. 290–293, 334–349.

* cited by examiner

*Primary Examiner*—David Nelms
*Assistant Examiner*—Mai-Huong Tran
(74) *Attorney, Agent, or Firm*—Laurence A. Greenberg; Werner H. Stemer; Ralph E. Locher

(57) ABSTRACT

A storage cell field has a plurality of storage cells formed in a substrate of a first doping type, said storage cells comprising a trench capacitor arranged in said substrate and a selection transistor associated with said trench capacitor and provided with a transistor body which is arranged in said substrate. An implantation having an increased dopant concentration of the first doping type is provided in said substrate. This implantation prevents space-charge zones, which are located at the trench capacitors and which are caused in predetermined storage states of said trench capacitors, from constricting a substrate region, which is available for applying a predetermined potential to the transistor bodies, in such a way that said predetermined potential cannot be applied.

9 Claims, 6 Drawing Sheets

STORAGE CELL FIELD AND METHOD OF PRODUCING THE SAME

BACKGROUND OF THE INVENTION

1. Field of the Invention

The present invention relates to a storage cell field and a method of producing the same and, in particular, to a storage cell field in which a storage cell comprises a selection transistor and a trench capacitor, as in the case of conventional DRAM storage cells.

2. Description of Prior Art

In known DRAM storage cells comprising a selection transistor and an associated trench capacitor, which are formed in a substrate, a certain potential is applied to the transistor bodies of the selection transistors by electrically coupling the transistor bodies to a substrate terminal via the underlying substrate region.

SUMMARY OF THE INVENTION

It is the object of the present invention to provide a storage cell field which, even in the case of markedly reduced structural sizes, still guarantees a connection between the transistor body and the substrate, as well as a method of producing such a storage cell field.

According to a first aspect of the invention this object is achieved by a storage cell field comprising a plurality of storage cells formed in a substrate of a first doping type, said storage cells comprising a trench capacitor arranged in said substrate and a selection transistor associated with said trench capacitor and provided with a transistor body which is arranged in said substrate; and an implantation having an increased dopant concentration of the first doping type in said substrate and preventing space-charge zones, which are located at the trench capacitors and which are caused in predetermined storage states of said trench capacitors, from constricting a substrate region, which is available for applying a predetermined potential to the transistor bodies, in such a way that said predetermined potential cannot be applied.

The present invention is based on the finding that, when storage cells, especially DRAM storage cells, are miniaturized to an increasing extent with feature sizes of less than 100 nm, a connection between the transistor body and the substrate may, in the case of given storage cell architectures, be prevented due to space-charge zones existing at the trench capacitors so that adapted measures have to be taken for still guaranteeing the necessary low-ohmic substrate terminals of the selection transistor. What is particularly important in this connection is the space-charge zone which is produced by a high state, i.e. a charge applied to the trench capacitor, in the trench of the capacitor at the collar region thereof. The increasing degree of miniaturization of cell layouts has the effect that the room remaining between the deep trenches in the collar region of juxtaposed trench capacitors is less than 100 nm. In this area between the deep trenches, it has hitherto been guaranteed that the body terminal of the selection transistor remained connected to the substrate. Since, depending on the doping of the substrate, the above-mentioned space-charge zone of the trench capacitors may be in the order of magnitude of a few nanometres up to a few 10 nm, structural sizes of less than 100 nm may lead to a constriction effect of the substrate region between neighbouring trench capacitors of such a nature that the transistor body may be separated from a substrate terminal in the case of disadvantageous write states of neighbouring cells, i.e. a simultaneously high state.

In conventional trench capacitors having buried connection areas, so-called buried straps, which are defined by areas that are heavily doped in comparison with the substrate, the doping of the substrate must not be too high, e.g. in the range of a few $10^{17}$ cm$^3$, in the relevant region, since otherwise the leakage currents would be excessively high. When the substrate has this kind of doping level, the space-charge zones produced at the trench capacitors may easily cause a constriction of such a nature that a connection between the transistor body and the substrate terminal is no longer given; this will be the case if the remaining flow cross-section offers an excessively high resistance due to the light doping or if, in the worst case, the space-charge zones produced contact one another from four sides.

In known storage cell fields the above-mentioned problem has not arisen up to now, since, when the structural sizes clearly exceed 100 nm, the space-charge zones are small in comparison with the room between the deep trenches of the trench capacitors.

According to the present invention, the above-mentioned problem is solved by producing in the substrate an implantation of the doping type corresponding to that of the substrate, in such a way that the BULK contact of the selection transistor remains connected to the underlying substrate, or, in other words, that the transistor body remains electrically coupled to a substrate terminal so that the application of a predetermined potential to the transistor body is still possible. Where and how such an implantation is to be provided in the substrate depends on the respective architecture of the storage cell field; in the description of preferred embodiments of the present invention following hereinbelow, two special architectures will be dealt with. In any case, the dimensions of the space-charge zones of the trench capacitors are kept small by higher doping, in a p-type substrate by higher p-type doping, in accordance with the present invention by increasing the dopant concentration at locations at which such an increase is not forbidden in view of other effects, e.g. an excessively high leakage current in the area of the buried strap. It follows that a connection between the transistor body and the substrate regions which are located further down and which are more heavily doped from the very beginning continues to exist.

According to a second aspect of the invention the above object is achieved by a method of producing a storage cell field, said method comprising the following steps:

producing a plurality of storage cells in a substrate of the first doping type, said storage cells comprising a trench capacitor arranged in said substrate and a selection transistor associated with said trench capacitor and provided with a transistor body which is arranged in said substrate, and producing in said substrate an implantation that has an increased dopant concentration of the first doping type and that prevents space-charge zones, which are located at the trench capacitors and which are caused in predetermined storage states of said trench capacitors, from constricting a substrate region, which is available for applying a predetermined potential to the transistor bodies, in such a way that said predetermined potential can no longer be applied.

Further developments of the present invention are specified in the dependent claims.

BRIEF DESCRIPTION OF THE DRAWINGS

In the following, preferred embodiments of the present invention will be explained in detail making reference to the drawings enclosed, in which.

DESCRIPTION OF PREFERRED EMBODIMENTS OF THE INVENTION

In the following, the present invention will be explained in detail on the basis of two storage cell field architectures, a MINT architecture (MINT=Merged Isolation Node Trench) and a BSSGT cell field architecture (BSSGT= Buried Strap Surrounding Gate Transistor).

Figure 1:
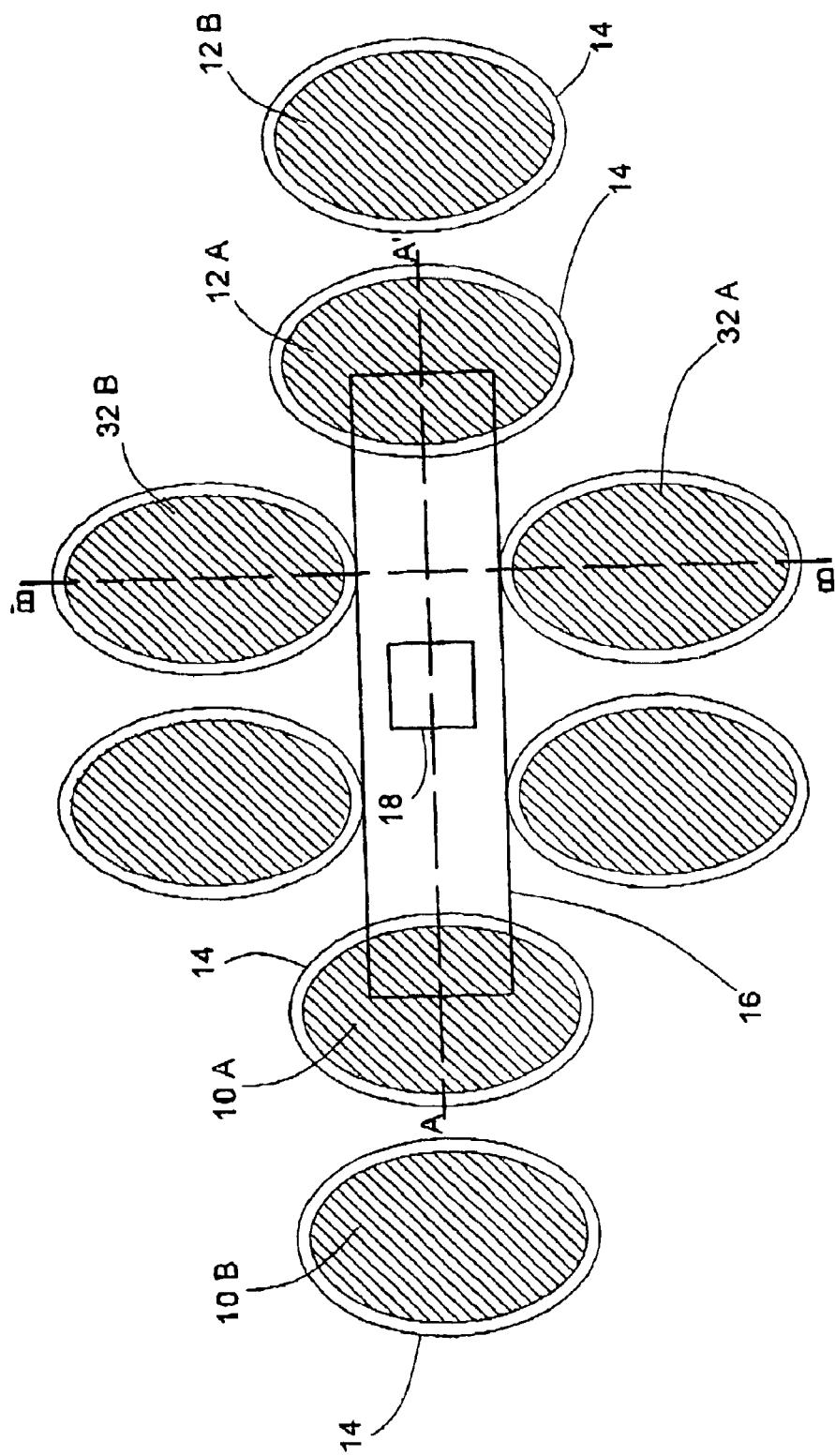
FIG. 1 shows a schematic view of a cell field of a first storage cell architecture.

FIG. 1 shows a detail of a MINT cell field in a cross-sectional representation, the section extending on the level of the upper trench region of the trench capacitors of such an architecture where the buried strap is still visible.

As can be seen in FIG. 1, the MINT architecture comprises respective pairs of juxtaposed trench capacitors in the form of so-called deep trenches. For example, the two trenches of the trench capacitors 10a and 10b define a pair, so do the two trenches of the trench capacitors 12a and 12b.

FIG. 1 additionally shows the buried connection areas (buried straps) 14 associated with a respective trench capacitor. Between the trench capacitors 10a and 12a, which comprise respective deep trenches, an active region 16 is arranged, which is only schematically shown. In said active region 16, the selection transistors for the trench capacitor 10a and the trench capacitor 12a are formed. A source connection implantation 18 for the selection transistors of the capacitor trenches 10a and 12a is shown, again schematically, within the active region.

It should here be pointed out that the cross-sectional view of FIG. 1 shows an intermediate stage in the production of a MINT cell field in the case of which the respective capacitor trenches are each completely surrounded by a buried strap. Taking as a basis the form shown in FIG. 1, a complete etching of the substrate surface, with the exception of the active region 16 and of the other active regions (not shown), is carried out in the course of the further processing; due to this complete etching, the buried strap will finally remain only below the active region. The deep trenches of the trench capacitors are not influenced by this etching, since they are located below the plane down to which said etching takes place.

Figure 2:
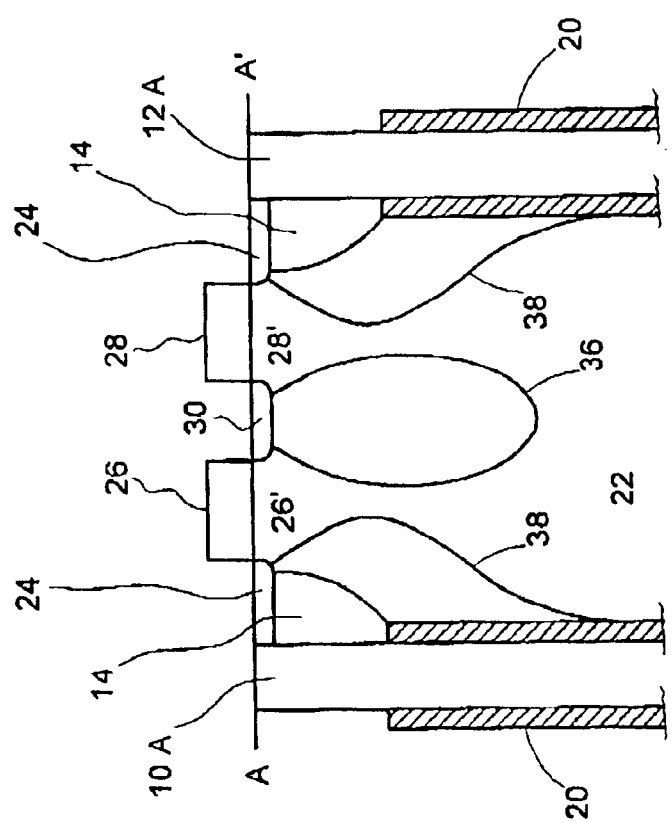
FIG. 2 shows cross-sectional view essentially representing a sectional view along the line A–A' in FIG. 1.

A schematic sectional view along the line A–A' of FIG. 1 is shown in FIG. 2. FIG. 2 shows the two trench capacitors 10a and 12a which have a respective oxide collar 20. The oxide collar 20 is provided for interrupting, subsequent to later completion, a parasitic vertical transistor between the buried strap (n-doped), the silicon substrate (p-doped) and the buried plate (n-doped, not shown), via which the external trench electrode is connected. Above the oxide collar 20, the respective buried strap 14, i.e. the buried connection area, for the trench capacitors is shown. The substrate 22 in which the storage cell field is formed is preferably a p-type substrate so that the buried straps 14 represent $n^+$-regions. The areas which are here referred to as substrate are normally well-shaped areas formed in a starting wafer or starting substrate. In the normal form, the area referred to as a substrate 22 is a p-type well above an n-type well (not shown), which is, in turn, located in a lightly doped p-type substrate (not shown).

The exact structural design of the trench capacitors corresponds to that of conventional storage capacitors for DRAMs and, consequently, it need not be explained in detail here. The $n^+$-regions, which represent the buried straps 14, are connected to respective drain regions 24 of the selection transistors which are associated with the trench capacitors 10a and 12a and which are defined by $n^+$-regions as well. These transistors are schematically shown in FIG. 2 in connection with reference numerals 26 and 28 and they have a common source region 30.

Figure 3:
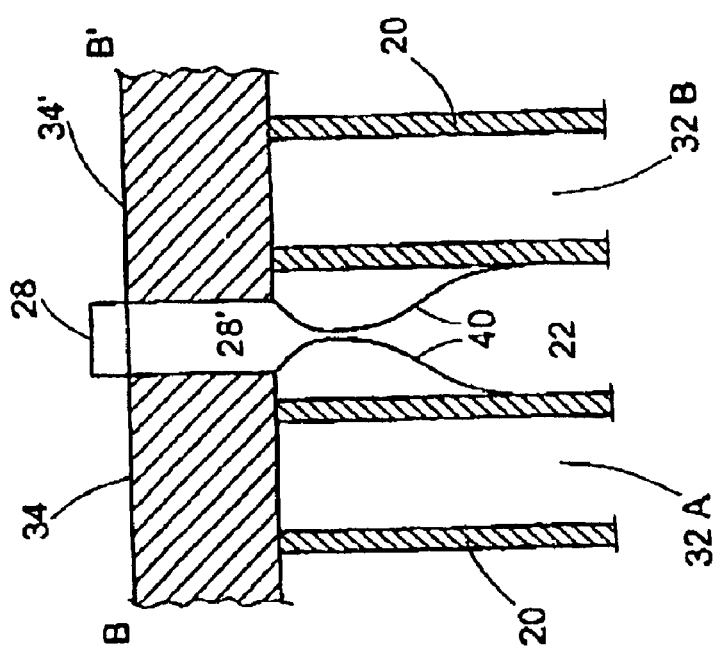
FIG. 3 shows a cross-sectional view representing, essentially schematically, a sectional view along the line B–B' in FIG. 1.

A schematic cross-sectional view along the line B–B' in FIG. 1 is shown in FIG. 3. FIG. 3 shows a section through the two trench capacitors 32a and 32b, which are again provided with respective oxide collars. Furthermore, the selection transistor 28, which comprises a transistor body 28', is schematically shown in FIG. 3. FIG. 3 also shows a thick oxide layer 34, which, after the etching back of the substrate described herein-before with reference to FIG. 1, is applied so as to fill the free spaces resulting from such etching back.

In FIG. 2, a p-type implantation 36, e.g. a boron implantation, is provided in the substrate region between the two trench capacitors 10a and 12a. Depending on the doping of the p-type substrate, the doping level for the p-type implantation can be in a range of from $10^{17}/cm^3$ to $10^{19}/cm^3$; in a preferred embodiment this doping level is $2 \cdot 10^{18}/cm^3$.

This implantation is provided so as to guarantee that, even in the case of very small structural sizes below 100 nm, a connection of the transistor bodies 26' and 28' to the underlying substrate 22 can still be guaranteed. In the example described with reference to FIGS. 1 to 3, the implantation 36 can be carried out by means of doping through the source contact mask, i.e. through the source region 30. Alternatively, the doping for producing the implantation can take place at an arbitrary suitable stage of the process, e.g. before the transistor structures are produced, making use of a suitable mask.

Making reference to FIGS. 2 and 3, the effect on the implantation 36 provided according to the present invention will now be described.

Depending on a current storage state, the inner electrode (not shown), which is connected to the buried strap, is at a predetermined potential. In a high state, the inner electrode and the buried strap are e.g. at a voltage of 1.8 V. The substrate 22 and the transistor bodies 26' and 28' have, however, applied thereto a predetermined potential, e.g. between 0 and −1 V. This has the effect that a respective space-charge zone 38 is created at the trench capacitors 10a and 12a. The shape of the space-charge zone 38 shown in FIG. 2 is a result of the doping height which increases with substrate depth. Furthermore, due to the $n^+$p-type junction between the buried strap 14 and the substrate 22, a broad depletion zone, i.e. space-charge zone, is obtained in the area of the buried straps. Likewise, the trench capacitors 32a and 32b (FIG. 1) produce in the storage cell field architecture shown a respective space-charge zone 40 of the type schematically shown in FIG. 3. The space-charge zone shown here is exclusively a result of the potential difference between the deep trenches and the intermediate substrate.

In order to make things clearer, the space-charge zones 38 are shown in FIG. 2 such that a wide distance exists therebetween. If, starting from the structure shown, a further miniaturization is assumed, it will be apparent that, at a certain point, the space-charge zones of the neighbouring trench capacitors approach one another to such an extent that a connection of the transistor bodies 26', 28' to the underlying substrate 22 and, consequently, the substrate terminal is no longer given. As can be seen in FIG. 3, a further constriction of the substrate region is additionally effected below the transistor 28 by the space-charge zone 40 of the trench capacitors 32a and 32b. It follows that, in the case of an unfavourable write state, e.g. when the four cells 10a, 12a, 32a and 32b are all in a high state and when the structural sizes in question are sufficiently small, a connection of the transistor body 28' to the underlying substrate 22 and, consequently, the substrate terminal may be prevented completely, since the substrate region available for connection is constricted from four sides. This is prevented by the p-type implantation 36 provided according to the present invention, since this implantation limits the dimensions of the space-charge zones due to the fact that, in comparison with the substrate, it is more heavily doped.

It should here be pointed out again that, even if a close area remained between the space-charge zones of neighbouring trench capacitors without the implantation provided according to the present invention, the conductivity, which mainly depends on the doping, would be reduced to a great extent, i.e. an electric connection of the transistor bodies to the underlying substrate would be strongly limited due to the voltage drop occurring across the constricted portion. By means of the implantation, the present invention maintains an increased conductivity between the transistor bodies and the substrate even in the case of the most disadvantageous write state.

A second embodiment of a cell field according to the present invention will be explained hereinbelow making reference to FIGS. 4 to 6. In these figures, details of a BSSGT cell field are schematically shown.

Figure 4:
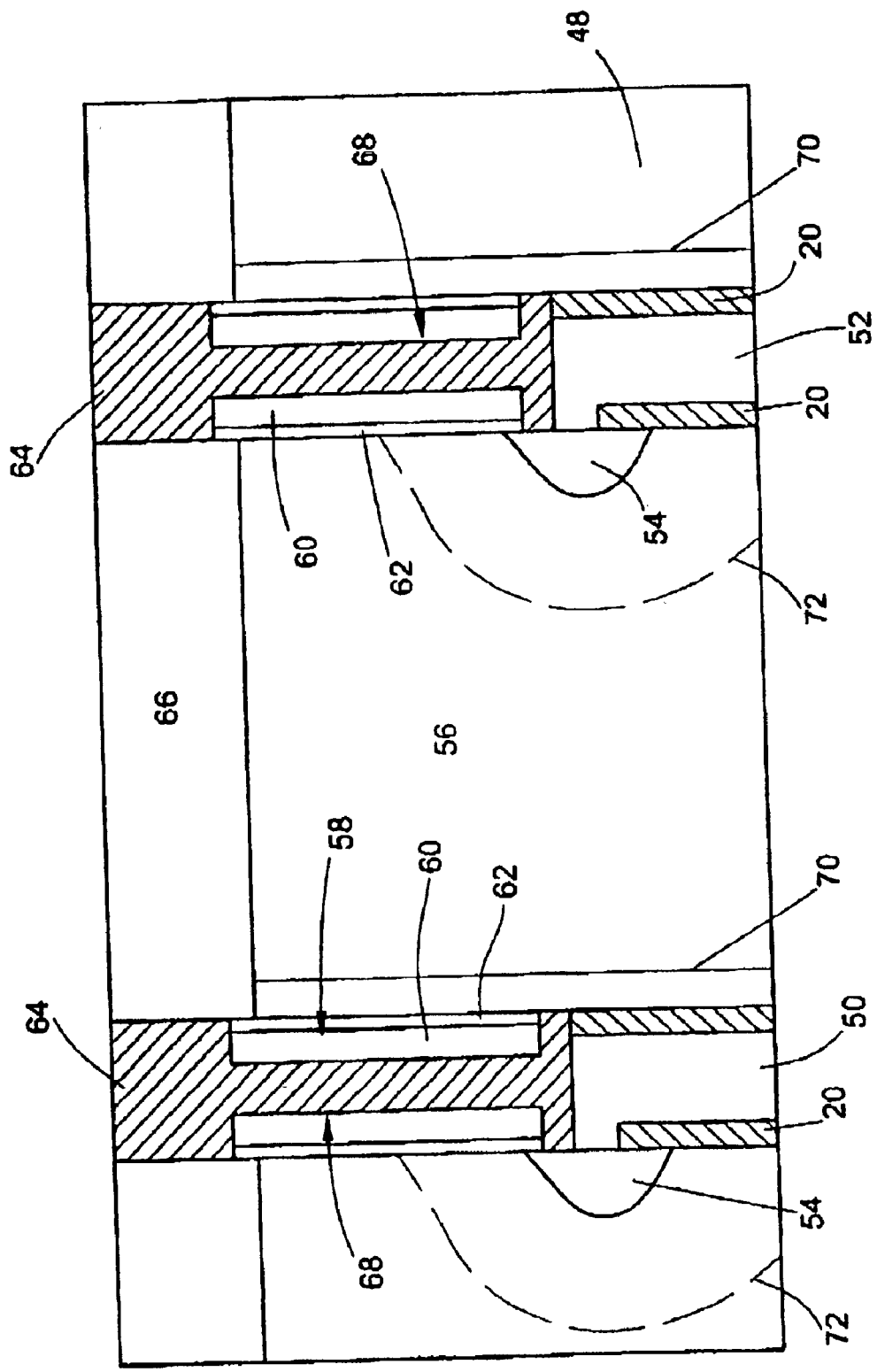
FIG. 4 shows a schematic cross-sectional view for explaining the present invention on the basis of a second storage cell architecture.

In the schematic cross-sectional view according to FIG. 4, the two trench capacitors with deep trenches and the associated oxide collars 20, which are formed in a substrate 48, are shown. A buried connection area 54, i.e. a buried strap, is provided on one side of each trench capacitor. The exact structural design of the trench capacitors corresponds again to a conventional structural design and need not be explained in detail here.

In this storage cell field architecture, each trench capacitor has associated therewith a vertical selection transistor. The vertical selection transistor is provided with a gate 58 surrounding a respective substrate region 56, as can be seen from the schematic view of FIG. 5. The gate 58 comprises a gate electrode 60 and a gate oxide 62, as can be seen in FIG. 4. The regions 64 cross-hatched in FIG. 4 represent insulating regions, preferably oxide regions. Furthermore, the selection transistor associated with the capacitor 52 comprises an n$^+$-doped source region 66 so that a selection transistor for the trench capacitor 52 is defined by the source region 66, the gate 58 and the buried strap 54, which additionally acts as a drain electrode. The regions designated by reference numeral 68 in FIG. 4 represent gate regions of neighbouring selection transistors.

Figure 5:
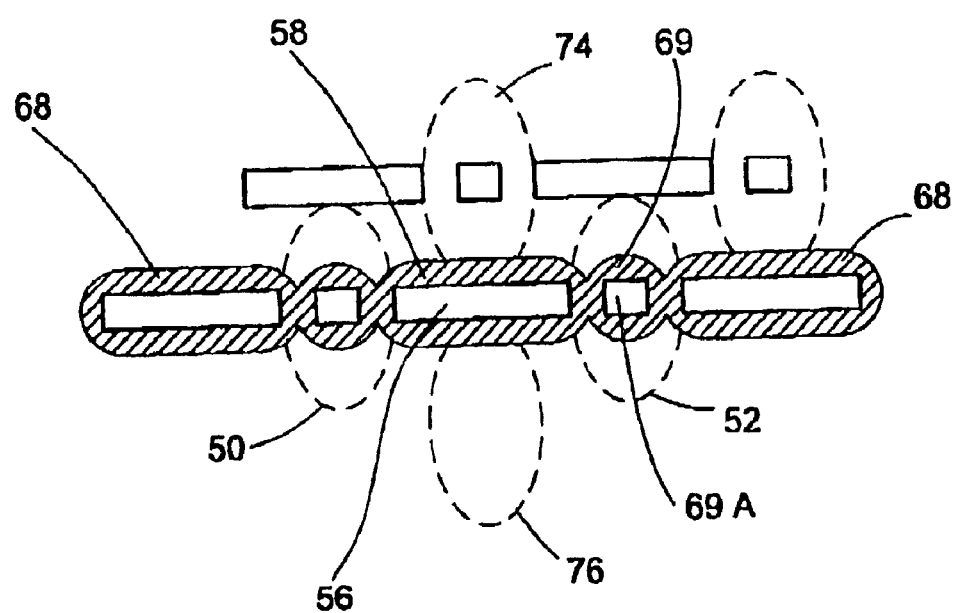
FIG. 5 shows a schematic representation for further explaining the second storage cell architecture.
Figure 6:
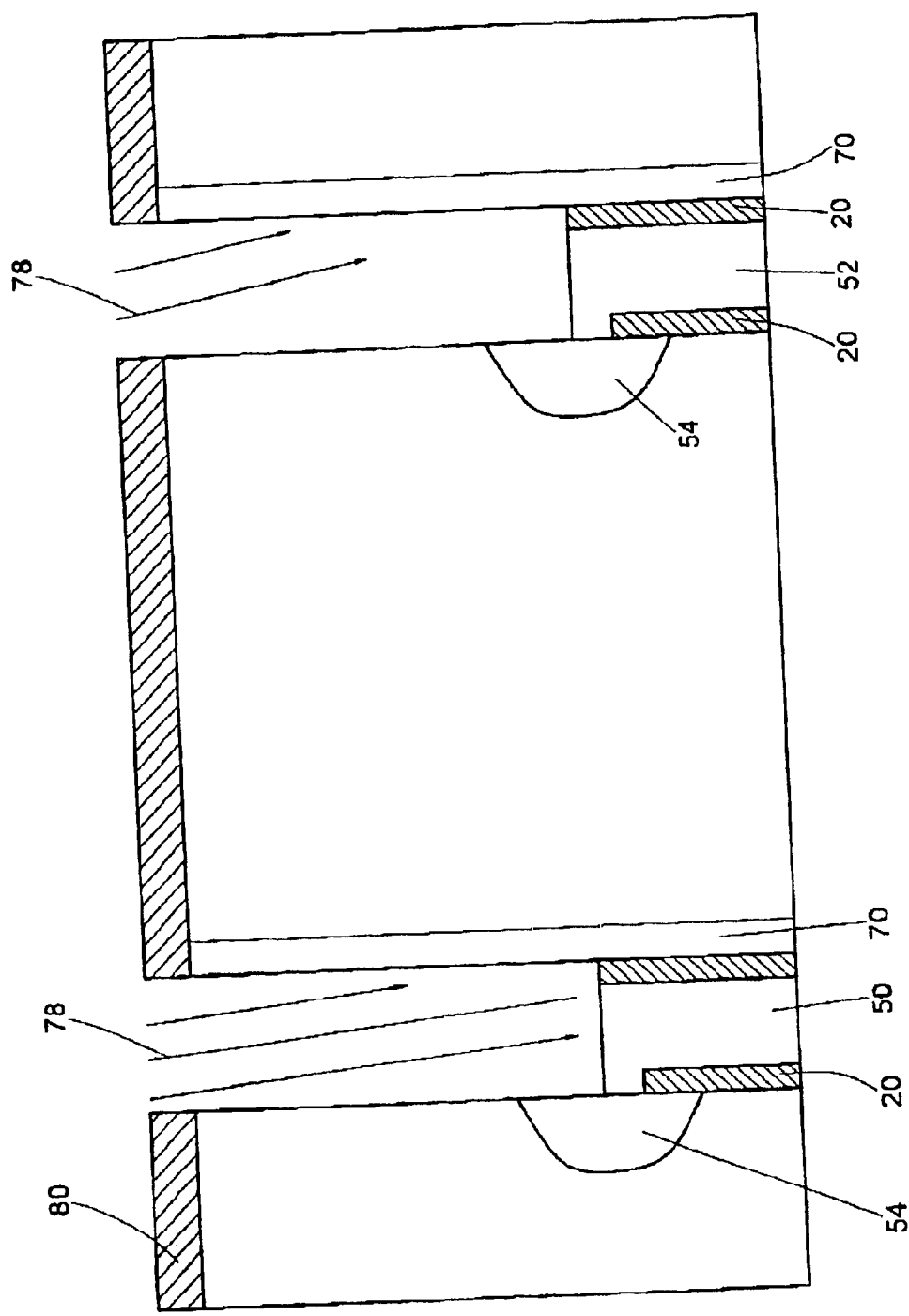
FIG. 6 shows a schematic cross-sectional view for explaining a method of producing the embodiment of the present invention shown in FIG. 4.

FIG. 5 shows the architecture of an BSSGT cell field in which the gate regions 58 and 68 of neighbouring vertical transistors are connected by connection areas 69 for which support structures 69a are provided. The thus connected gate regions represent respective word lines.

As can additionally be seen in FIG. 4, a p-type implantation 70 having a higher doping level than the substrate 56 is provided in the area of the p-type substrate 56. The implantation 70 prevents a formation of a space-charge zone on the trench capacitor side which is located opposite to the buried straps 54.

When the trench capacitors 50 and 52 are on a high level, a space-charge zone 72 again results from a respective potential difference. By providing the implantation 70, it is therefore guaranteed in this cell field architecture that, even in the case of small structural dimensions, the space-charge zones of neighbouring trench capacitors, e.g. of the trench capacitors 50, 52, 74 and 76 in FIG. 5, cannot constrict the substrate region 56 in such a way that the substrate region below the source connection area 66, i.e. the transistor body, is no longer connected to a substrate terminal, so that a predetermined potential can no longer be applied to this region.

Also in the storage cell field architecture shown in FIG. 4, the p-type dopant concentration is again increased at locations at which a buried strap does not exist, since otherwise excessively increasing leakage currents would occur. In this embodiment, the increase in the p-type dopant concentration can be achieved by carrying out an oblique implantation in the not fully filled trench of a trench capacitor, as is schematically shown in FIG. 6. The oblique implantation used is schematically represented by the arrows designated by reference numeral 78. Depending on the component design, such an oblique implantation for producing the areas of increased p-type dopant concentration, i.e. the implantations 70, can be carried out before or after a first trench filling and a respective etching back. In any case, the oblique implantation is carried out such that the implantations 70 are arranged on the sides of trench capacitor or of the gate structures formed in the upper trench region which are located opposite to the buried straps 54. FIG. 6 shows the oblique implantation after the filling of the trench and after etching back thereof making use of a suitable implantation mask 80.

It follows that, according to the present invention, the dimensions of the space-charge zone can be kept small by increasing the dopant concentration at locations at which the buried strap does not prohibit high p-doping. Although only two storage cell field architectures have been explained within the framework of the above description, it is clearly evident that the present invention can be applied to arbitrary storage cell field architectures so as to be able to guarantee a connection of the transistor bodies of respective selection transistors to an underlying substrate region and, consequently, to a substrate terminal.

| List of reference numerals | |
|---|---|
| 10a, 10b, 12a, 12b | trench capacitors |
| 14 | buried straps |
| 16 | active region |
| 18 | source connection implantation |
| 20 | oxide collar |
| 22 | substrate |
| 24 | drain region |
| 26, 28 | selection transistors |
| 26', 28' | transistor bodies |
| 30 | common source region |
| 32a, 32b | trench capacitors |
| 34 | oxide layer |
| 36 | implantation |

-continued

List of reference numerals

| | |
|---|---|
| 38 | space-charge zones |
| 40 | space-charge zones |
| 48 | substrate |
| 50, 52 | trench capacitors |
| 54 | buried strap |
| 56 | substrate region |
| 58 | surrounding gate |
| 60 | gate electrode |
| 62 | gate oxide |
| 64 | oxide area |
| 66 | source region |
| 68 | gate regions of neighbouring selection transistors |
| 69 | gate connection areas |
| 69a | support stuctures |
| 70 | implantation |
| 72 | space-charge zone |
| 74, 76 | trench capacitors |
| 78 | oblique implantation |
| 80 | implantation mask |

What is claimed is:

1. A storage cell field comprising:
a plurality of storage cells formed in a substrate of a first doping type, said storage cells including a trench capacitor arranged in said substrate and a selection transistor associated with said trench capacitor and provided with a transistor body which is arranged in said substrate,
an implantation having an increased dopant concentration of the first doping type in said substrate and preventing space-charge zones at the trench capacitors, which are caused in predetermined storage states of said trench capacitors, from constricting a substrate region, which is available for applying a predetermined potential to the transistor bodies, in such a way that said predetermined potential cannot be applied.

2. A storage cell field according to claim 1, wherein two lateral selection transistors are arranged between two trench capacitors, wherein the selection transistors each comprise a drain region of a second doping type which is connected to a buried connection area of the second doping type of an associated trench capacitor, wherein the two selection transistors arranged between the trench capacitors have a common source region between the drain regions, and wherein the implantation is provided in the substrate below said source region.

3. A storage cell field according to claim 1, wherein each trench capacitor has associated therewith a vertical selection transistor, wherein each trench capacitor has a buried connection area of a second doping type on one side thereof, wherein the implantation between juxtaposed trench capacitors is arranged adjacent to the side of the trench capacitors which is located opposite to the buried connection area.

4. A storage cell field according to claim 1, wherein the substrate is a p-type substrate and the implantation is a boron implantation.

5. A method of producing a storage cell field, the method comprising the following steps:
producing a plurality of storage cells in a substrate of a first doping type, the storage cells including a trench capacitor arranged in the substrate and a selection transistor associated with the trench capacitor and provided with a transistor body which is arranged in the substrate,
producing in the substrate an implantation that has an increased dopant concentration of the first doping type and that prevents space-charge zones, which are located at the trench capacitors and which are caused in predetermined storage states of the trench capacitors, from constricting a substrate region, which is available for applying a predetermined potential to the transistor bodies, in such a way that the predetermined potential can no longer be applied.

6. A method according to claim 5, wherein two lateral selection transistors are produced between two trench capacitors, the selection transistors having a common source region, wherein dopants are introduced through the source region into the substrate during the step of producing the implantation.

7. A method according to claim 5, wherein the implantation is produced by carrying out an oblique implantation into the trench of the trench capacitor so that an implanted region is produced on one side of the trench.

8. A method according to claim 7, wherein the oblique implantation is carried out such that the implanted region is produced in opposed relationship with a buried connection area of the trench capacitor.

9. A method according to claim 5, wherein a p-type substrate is used and wherein boron is used as a dopant for producing the implantation.

* * * * *